United States Patent
Jenkins

(10) Patent No.: US 6,433,612 B1
(45) Date of Patent: *Aug. 13, 2002

(54) METHOD FOR ACHIEVING LOW FEED-THROUGH AND CONSISTENT TRANSITION DELAY IN A MULTIPLEXOR CIRCUIT

(75) Inventor: Julian L. Jenkins, Santa Cruz, CA (US)

(73) Assignee: HiBand Semiconductors, Inc., Scotts Valley, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/791,805

(22) Filed: Feb. 21, 2001

(51) Int. Cl.[7] ............................................... H03K 17/62
(52) U.S. Cl. ....................................... 327/408; 327/404
(58) Field of Search .............................. 327/52, 65, 71, 327/355–360, 403, 404, 407–413, 560–563

(56) References Cited

U.S. PATENT DOCUMENTS

| | | | |
|---|---|---|---|
| 4,982,119 A | * 1/1991 | Tateishi | 327/65 |
| 5,182,467 A | * 1/1993 | Taylor et al. | 327/408 |
| 5,942,929 A | * 8/1999 | Aparin | 327/233 |
| 6,100,760 A | * 8/2000 | Maruyama et al. | 327/359 |
| 6,140,845 A | * 10/2000 | Benachour | 327/199 |
| 6,239,646 B1 | * 5/2001 | Navabi et al. | 327/407 |

* cited by examiner

Primary Examiner—Terry D. Cunningham
Assistant Examiner—Long Nguyen
(74) Attorney, Agent, or Firm—Donald R. Boys; Central Coast Patent Agency, Inc.

(57) ABSTRACT

A multiplexor circuit for performing time-division-multiplexing comprises two or more input signal pairs comprising individual signal lines for providing timed data input into the multiplexor circuit, the pairs alternately selectable for operation, two or more select lines for selecting alternate ones of the input signal pairs during operation, one or more output lines comprising signal output of the circuit and two or more resistive output loads and associated electronic gates. When a specific input pair is not selected for output, the not-selected input pair is not directly connected to the output lines of the circuit but is instead connected to individual ones of the resistive output loads enabled by the associated gates.

4 Claims, 2 Drawing Sheets

METHOD FOR ACHIEVING LOW FEED-THROUGH AND CONSISTENT TRANSITION DELAY IN A MULTIPLEXOR CIRCUIT

FIELD OF THE INVENTION

The present invention is in the field of serial data transmission as it applies to computerized semiconductor devices, and pertains more particularly to methods and apparatus for achieving low feed-through and consistent transition delay in a multiplexor circuit.

CROSS REFERENCE TO RELATED DOCUMENTS

The present application is related to a disclosure document #487065 filed in the USPTO on Jan. 4, 2001 entitled "Method for Achieving Low Feed Through and Consistent Transition Delay in a Multiplexor Circuit"

BACKGROUND OF THE INVENTION

The art of designing and implementing Large Scale Devices (LSI) and very large scale integration (VLSI) devices in digital logic has become more complex and sophisticated in recent years. Sophisticated software design tools and automated techniques have replaced prior pencil and paper engineering practices once used to design semiconductor devices. As semiconductor devices have become more complex in terms of circuitry and design with shrinking device geometry, requirements for data transmission between such devices and on individual ones of such devices have also become more complex and demanding to maintain in operation.

The preferred system used for data transmission between IC devices has long been the system of parallel data transfer. The current parallel method of passing data between such devices incorporates the use of a plurality of separate data-signal transmission paths in parallel. Data passed between two communicating devices travels across a circuit board on a plurality of parallel traces or lines. For a 16-bit system, for example, there will be in a parallel system a separate trace for each bit (16 traces) plus control lines.

Generally speaking, much operational and specification data regarding the manufacture and operation of VLSI and LSI type devices is known and available in the art. Manufacturers of such devices provide exhaustive documentation, and virtually all such documentation is available to the skilled artisan. Therefore detailed architectural and functional descriptions of known IC devices are not provided herein. It is enough to say that parallel data must be clocked, synchronized and latched in order to enable successful transmission of the data from a propagating device to a receiving device over a circuit board containing a substantially large number of traces.

Another system for transferring data in general, and also sometimes used for transferring data between IC devices, is the well-known serial system. The current art serial method of transferring high bandwidth data between IC devices involves the use of encoding and decoding circuits on each communicating device to manipulate or convert parallel data so that it may be transmitted serially across a circuit board from one device to another. For example, a parallel to serial data converter in a sending device enables data to be prepared for transmission out in a serial manner using a single data line for one-way transmission. A decoder circuit in a receiving device decodes the serial data using a pre-determined decoding scheme then processes the data. At a given clock speed for both types of transmission, serial data transfer is typically slower than parallel transfer. Therefore, a high-speed clock is typically used with the serial method to speed up transmission of serial data between devices.

Another problem with serial data transfer between IC devices in current technology is that analog circuitry is typically required in the IC devices to effect the system. Analog circuitry is known to be notoriously more difficult to implement than digital circuitry, and makers of digital IC devices are not anxious to suffer the yield losses attendant on adding analog circuitry to their devices.

Still, even with the known and perceived disadvantages of serial data transmission, the high cost and complexity of parallel systems is an increasing problem. As computing systems have matured from 4 to 8 to 16 to 32 bit words, and as microprocessors and memories (for example) have become more functional and sophisticated, the number of traces and pins necessary to accomplish adequate transmission has increased dramatically. It is, for example, common now to have plural sets of parallel data transmission pathways serving a single IC device. The high number of traces necessary on a PC board (for example) makes such support systems enormously complex and expensive to design and manufacture. Moreover, every trace demands a separate pin on the IC device. Many devices have more than two hundred pins, and future devices may demand even more. The ever increasing pin counts inherent to such devices makes such devices more complex to build and increases losses (low yield) in fabrication.

A serial communication system used between two or more IC devices is known to the inventor. The system utilizes a separate master chip connected to both of the IC devices, the master chip having a clock generator and circuitry for affecting serial data transmission and control between the master chip and the devices. There is a slave component on each IC device for transforming data between parallel and serial data formats and for sending and receiving a serial data stream. The master chip provides a clock signal to both slave components for gating serial data communication, and manages all communication between the two slave components. In a preferred embodiment, all circuitry in the slave components is digital circuitry, and all analog circuitry is implemented on the master chip. Also in a preferred embodiment each slave periodically checks phase between data stream and clock stream received, and inserts a correction code in the data stream sent back to the master chip, so the master chip can regularly correct the phase for clock and data sent to each slave.

It is known in the art of digital logic that a multiplexor circuit is used to multiplex more than one digital input on to a single output line. Technically, this process is known as Time Division Multiplexing (TDM). High-speed multiplexing is typically implemented with Current Mode Logic CML gates. A relatively high current is required to operate a CML multiplexor at desired clock frequencies. As a result, standard CML multiplexors exhibit some performance problems related to standard prior-art design and the higher current applied as compared to other multiplexor circuits such as a CMOS multiplexor. In a standard CML multiplexor there are two input pairs that are alternately selected via two select lines for multiplexing to the output of the circuit. When one of the input pairs is disabled (not selected) it is still directly connected to the output of the multiplexor. This creates a capacitive path from the input pair to the output pair. The resulting undesirable phenomenon is known as feed-through in the art. Another problem is that the internal nodes of the disabled input structure, in particular the source terminals of the input pair, are allowed to float. This causes the source voltage to be poorly defined when the pair is again selected. This uncertainty of proper voltage translates into an uncertainty in the time from the instant of selecting this previously disabled pair to a time when the output stabilizes. It is, of course, desired that these phenomena be largely reduced in order to improve performance of a multiplexor circuit.

Therefore, what is clearly needed is a multiplexor circuit design that will provide symmetry to a multiplexing operation so that feed-through is sharply reduced, certainty of voltage and timing is improved and therefore predictability in operation is greatly enhanced.

SUMMARY OF THE INVENTION

In a preferred embodiment of the present invention, a multiplexor circuit for performing time-division-multiplexor is provided. The mulitplexor circuit comprises, two or more input signal pairs, the pairs comprising individual signal lines for providing timed data input into the multiplexor circuit, the pairs alternately selectable for operation, two or more select lines for selecting alternate ones of the input signal pairs during operation, one or more output lines comprising signal output of the circuit and two or more resistive output loads and associated electronic gates. When a specific one or ones of the input pairs is not selected for output, the non-selected input pair is not directly connected to the output lines of the circuit, eliminating the capacitive feed through, but is instead connected to an individual one or ones of the resistive output loads enabled by the associated gates to initialize the internal voltages of the non-selected structure to the voltages they would be if the input was selected, to greatly reduce the variation in settling time when this output is later selected.

In a preferred embodiment, the circuit is implemented with current mode logic. In one embodiment, the circuit is implemented on a single IC device. In another embodiment, the circuit is implemented on more than one separate but connected devices.

In another aspect of the present invention, a method for reducing capacitive feed-through and timing uncertainty from a non-selected signal-input pair to output of a multiplexor circuit, the circuit having at least one additional resistive output load and associated electronic gates is provided. The method comprises the steps of, (a) changing the selection structure from a current steering selection to a switching selection connected to the output nodes, (b) dividing the current sinking capabilities to accommodate the separate input structures that are no longer supplied current by the selection structure and (c) providing at least one additional resistive output load and associated electronic gates to maintain the biasing of these current sinks and initialize the internal voltages of the non-selected structure to the voltages they would be if the input was selected.

In a preferred embodiment, the circuit is implemented with current mode logic. In one aspect of the method steps (a)–(c) are accomplished with circuitry implemented on a single IC device. In another aspect of the method in steps (b) and (c), the number of additional current sinking structures and output loads and associated electronic gates is directly proportional to the number of input pairs that are not selected to output at any given time during operation of the circuit.

Now, for the first time, a multiplexor circuit design that will provide symmetry to a multiplexing operation so that feed-through is sharply reduced and timing certainty and therefore predictability in operation is greatly enhanced is provided.

BRIEF DESCRIPTION OF THE DRAWING FIGURES

DESCRIPTION OF THE PREFERRED EMBODIMENTS

According to an embodiment of the present invention, a symmetric multiplexor circuit is provided that acts to suppress circuit feed-through and reduce timing uncertainty providing a more efficient and clean output signal.

Figure 1:
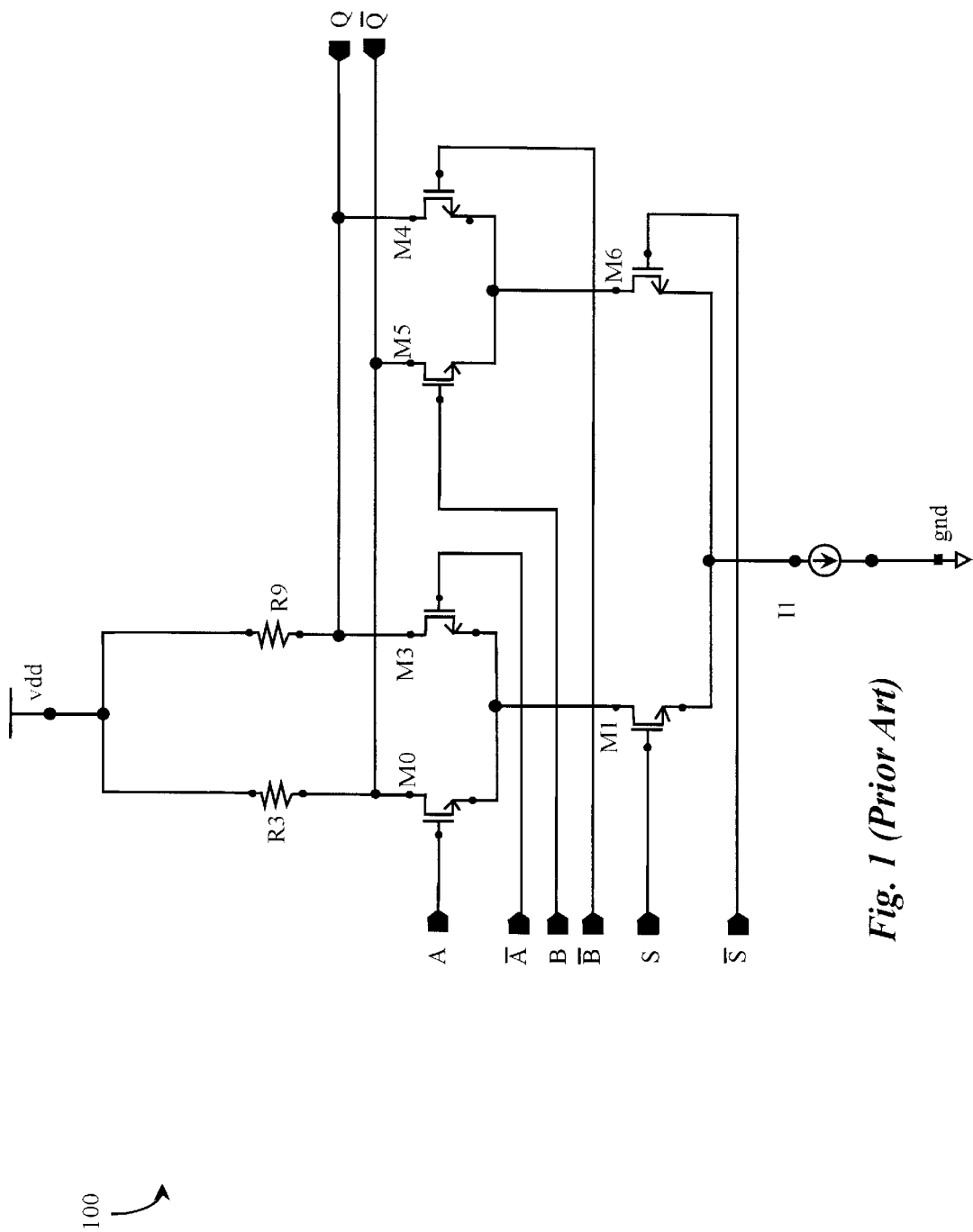
FIG. 1 is a circuitry diagram of a multiplexor circuit according to prior art.

FIG. 1 is a circuitry diagram of multiplexor circuit 100 according to prior art. As noted with reference to the background section above, a multiplexor circuit is used to multiplex more than one digital input onto, generally, a single output line. Technically, this process in one aspect is known as Time Division Multiplexing (TDM). Multiplexor 100 may be implemented in CMOS logic or CML logic. It is important to note herein that a CML multiplexor draws substantially more current than a CMOS multiplexor. Signal input within multiplexor 100 is represented herein by two input signal pairs A and $\overline{A}$ and B and $\overline{B}$. These signal input pairs are alternately selected to output as is generally known in the art. Select lines illustrated in this diagram are select line S for selecting input pair A and $\overline{A}$, and select line $\overline{S}$ for selecting input pair B and $\overline{B}$.

According to frequency and high/low voltage parameters, inputs of each described input pair are alternately selected to output. For example, when input pair A, $\overline{A}$ is selected by select line S, input A feeds to an output line represented herein as $\overline{Q}$. Input $\overline{A}$ feeds to an output line represented herein as Q. Gating for input pair A, $\overline{A}$ is accomplished through gates M0 and M3. Gating for input pair B, $\overline{B}$ is accomplished through gates M4 and M5 as is shown in this diagram. Selecting input pairs is accomplished through gates M1 for S and through M6 for $\overline{S}$. I1 is a current source.

A problem with typical Multiplexor architecture as represented by standard circuit 100 in FIG. 1 is that when one input pair is disabled (not selected) it is still directly connected to the output of the multiplexor. This creates a capacitive path from the input pair to the disabled output pair resulting in the undesirable phenomena known as feed-through (noise) in the art. This problem can greatly affect output quality of the circuit. In addition, the source terminals of the disabled (not selected) pair are allowed to float when the path to ground (gnd) is disabled. When the sources are allowed to float the source voltage is poorly defined when the output is again enabled, and this causes uncertainty in the time from when the select switches enable output and when the output becomes stable.

It is noted here, as was described above, that in lower voltage swing circuits such as CML circuits, there can be considerable feed-through and unpredictability. This is in part due to a fact that typically, the input pairs are directly connected to the output. One with skill in the art will recognize both standard operation of this prior-art circuit and that operation becomes more difficult and unpredictable at lower voltage swings.

Figure 2:
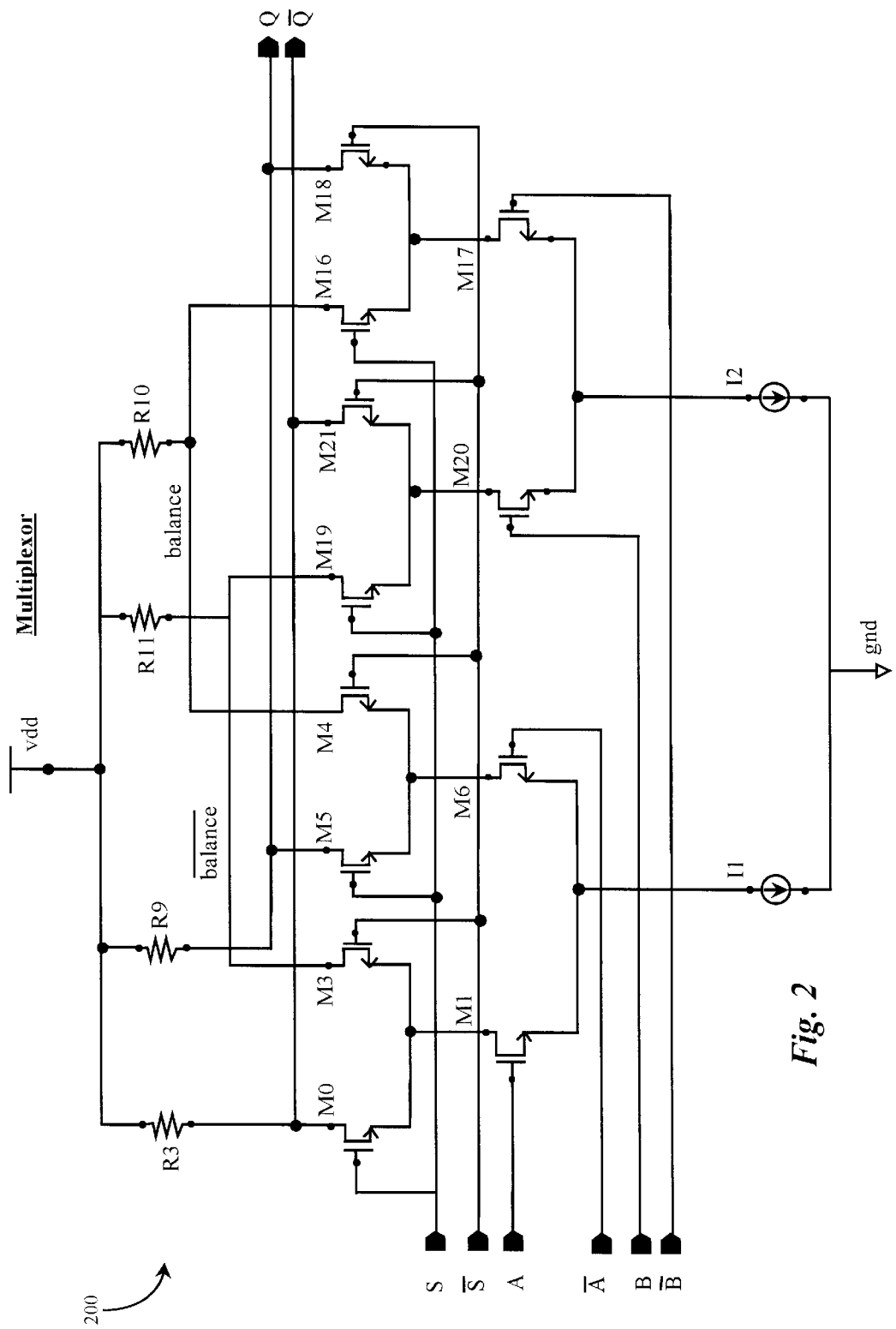
FIG. 2 is a circuitry diagram of a multiplexor circuit according to an embodiment of the present invention.

FIG. 2 is a circuitry diagram of a multiplexor 200 according to an embodiment of the present invention. In order to sharply reduce or eliminate undesired timing uncertainty in a multiplexor circuit, it is important that a symmetrical balance of currents and signals be provided. Any new structure must maintain the balance exhibited with reference to prior-art multiplexor circuit 100 of FIG. 1. Multiplexor circuit 200 is expanded in construction to provide circuitry to eliminate or at least sharply reducing undesired feedthrough (circuit noise) and voltage uncertainty while maintaining the balance of circuit 100.

Multiplexor 200 has the same input pairs A, $\overline{A}$ and B, $\overline{B}$ as prior-art circuit 100 of FIG. 1. Likewise, select lines S and $\overline{S}$ are present. However, unlike circuit 100, select lines S and $\overline{S}$ are more strategically located nearest to outputs Q and $\overline{Q}$ in order to exert direct control on the outputs. Additionally, there are illustrated 7 additional gates and 1 additional current source. These are gates M16, M17, M18, M19, M20, M21, and current source I2. One with skill in the art of circuitry will readily recognize that the additional gates and current sources along with added resist load R11 and R10 comprise, in essence, 2 separate multiplexor circuits. However, the added circuitry is for balancing the signal/voltage aspects of the circuit to give non-selected inputs a place to drive to allow otherwise floating nodes to be driven to appropriate levels.

The configuration represented herein requires that current source (I1) be split in order to feed the added gates described above, which are selectable as a group. It is reminded herein that the added gates are for enabling control and isolation of outputs Q and $\overline{Q}$ from disabled input pairs. The circuitry arrangement represented herein by circuit 200 allows for disabled pairs to be isolated from outputs and therefore greatly reduces capacitance feed-through. A "dummy" output load represented by resistors R10 and R11 is controlled by the inverse of the select signal. The effect of this dummy load is to maintain constant current flow through both current sources (input pairs) in order to avoid spikes or glitches when switching input pairs. This acts to stabilize delay from the time of selection to output stabilization. A benefit of delay stabilization is that the edges of signal waveforms are more tightly held within an acceptable window in terms of signal output.

In addition to the above, the circuitry configuration (multiplexor 200) described in the above paragraph has the effect of pre-charging nodes between inputs and select switches to the correct value before select switches cause outputs to change states, helping to reduce jitter (spurious signal effects). The resulting circuit is essentially equivalent to two multiplexors as described above, one driving outputs and a second driving the added dummy load (R10, R11).

It will be apparent to one with skill in the art that the present invention may be practiced in variations of the presented configuration without departing from the spirit and scope of the present invention as long as a balance is maintained in the circuit. The benefits of a cleaner output signal and predictable circuit operation outweigh the requirement of additional circuitry. It is noted herein that circuit 200 may be implemented in whole on a single IC device. In this example, circuit 200 is illustrated using an FET symbol to represent switching gates, however, any alternate switching gate may be used and would be illustrated with an appropriate symbol.

The inventor has provided an actual diagrammatic representation (circuit design) for multiplexor 200 and deems it sufficient for illustrative purposes for those with normal skill in the art in reading circuit diagrams. The discipline of understanding circuit diagrams is universal and well known in the electronic arts, and therefore precludes redundant and granular description of step-by-step circuit operation. The representation of circuit 200, however, should not be construed as limiting to the spirit and scope of the present invention. Furthermore, circuit 200 as described herein, may, instead of being contained on a single device, be implemented using separate and integrated devices, and is scalable according to number of input pairs desired. Therefore, the method of the present invention should be afforded the broadest possible scope under examination. The spirit and scope of the present invention is limited only by the claims that follow.

What is claimed is:

1. A multiplexor circuit for performing time-division-multiplexor comprising:

two or more alternate input signal pairs comprising individual signal lines for providing timed data input into the multiplexor circuit;

two or more select lines for selecting alternate ones of the input signal pairs during operation;

one or more output lines comprising an output signal pair;

a plurality of resistive output loads equal to the number of input signal lines of the input signal pairs and;

a plurality of electronic gates connected to the resistive output loads;

characterized in that the input pairs are alternately selected for output and when a specific input pair is not selected for output, the not-selected input pair produces capacitive feed-through that is not directly connected to the output lines of the circuit but is instead absorbed by individual ones of the resistive output loads enabled by the connected electronic gates, and further characterized in that the resistive output loads are enabled by the connected electronic gates.

2. The multiplexor circuit of claim 1, wherein the circuit is implemented with current mode logic.

3. The multiplexor circuit of claim 1, wherein the circuit is implemented on a single IC device.

4. The multiplexor circuit of claim 1, wherein the circuit is implemented on more than one separate but connected devices.

* * * * *